US012764910B2

(12) United States Patent
Goergen et al.

(10) Patent No.: US 12,764,910 B2

(45) Date of Patent: Oct. 13, 2026

(54) INTEGRATED ROUTER MODULAR DESIGN WITH MULTI-FUNCTION CONFIGURATIONS

(71) Applicant: Cisco Technology, Inc., San Jose, CA (US)

(72) Inventors: Joel Richard Goergen, Soulsbyville, CA (US); Alpesh Umakant Bhobe, Sunnyvale, CA (US); Kameron Rose Hurst, Sonora, CA (US); Elizabeth Kochuparambil, Morgan Hill, CA (US); Harikrishnan Pillai, San Jose, CA (US); Edward A. Warnicke, Austin, TX (US); Krishnagopal Goswami, Bangalore (IN); Giovanni Giobbio, Rovellasca (IT); Marco Croci, Carate Brianza MB (IT)

(73) Assignee: CISCO TECHNOLOGY, INC., San Jose, CA (US)

( * ) Notice: Subject to any disclaimer, the term of this patent is extended or adjusted under 35 U.S.C. 154(b) by 249 days.

(21) Appl. No.: 18/769,585

(22) Filed: Jul. 11, 2024

(65) Prior Publication Data

US 2026/0020196 A1 Jan. 15, 2026

(51) Int. Cl.

*H05K 7/20* (2006.01)

*G06F 1/26* (2006.01)

(52) U.S. Cl.

CPC ......... *H05K 7/20736* (2013.01); *G06F 1/266* (2013.01); *H05K 7/20781* (2013.01)

(58) Field of Classification Search

CPC . H05K 7/20736; H05K 7/20781; G06F 1/266

See application file for complete search history.

(56) References Cited

U.S. PATENT DOCUMENTS

| | | | | |
|---|---|---|---|---|
| 9,794,195 | B1 * | 10/2017 | Wilson | H04L 49/40 |
| 10,884,204 | B2 | 1/2021 | Iwama | |
| 12,389,527 | B2 * | 8/2025 | Rivaud | H05K 1/0213 |
| 12,419,010 | B2 * | 9/2025 | Shearman | G02B 6/4268 |
| 12,455,423 | B2 | 10/2025 | Nagarajan et al. | |
| 2003/0185536 | A1 | 10/2003 | Steinman et al. | |
| 2021/0105911 | A1 | 4/2021 | Yang et al. | |

(Continued)

FOREIGN PATENT DOCUMENTS

EP 3322197 A1 5/2018

OTHER PUBLICATIONS

Dobbelaere P.D., et al., “Silicon Photonics Technology Platform for Integration of Optical IOs with ASICs”, Luxtera, Aug. 26, 2013, 18 pages.

(Continued)

*Primary Examiner* — Robert J Hoffberg

(74) *Attorney, Agent, or Firm* — Edell, Shapiro & Finnan, LLC

(57) ABSTRACT

A device is provided that includes a chassis that contains at least one integrated circuit and a faceplate around a portion of the chassis. The faceplate having multiple face portions that expose a plurality of receptacles. At least one receptacle of the plurality of receptacles is a dual purpose receptacle configured to interchangeably receive an optical transceiver module or an artificial intelligence processor module and to enable connectivity with the at least one integrated circuit.

23 Claims, 9 Drawing Sheets

(56) References Cited

U.S. PATENT DOCUMENTS

| | | | | |
|---|---|---|---|---|
| 2021/0382252 | A1 | 12/2021 | Shearman et al. | |
| 2021/0409846 | A1 | 12/2021 | Leigh et al. | |
| 2022/0078532 | A1 | 3/2022 | Shearman et al. | |
| 2023/0067157 | A1 | 3/2023 | Minota | |
| 2023/0073931 | A1 | 3/2023 | Watkins et al. | |
| 2023/0088207 | A1 | 3/2023 | Shearman et al. | |
| 2023/0185751 | A1 | 6/2023 | Cannata et al. | |
| 2024/0040734 | A1 | 2/2024 | Carver et al. | |
| 2024/0179877 | A1* | 5/2024 | Rivaud | H05K 7/2039 |
| 2025/0063679 | A1* | 2/2025 | Shearman | H05K 7/1428 |
| 2025/0147256 | A1 | 5/2025 | Goergen et al. | |
| 2026/0013069 | A1* | 1/2026 | Frankel | H05K 7/1487 |

OTHER PUBLICATIONS

Duan P., "A Novel 3D Stacking Approach for Chip-to-chip Interconnects", Electro-Optical Communication, Eindhoven University of Technology, Nov. 19, 2014, 160 pages.

Yeluri S., "Silicon Photonics and Integrated Optics", Juniper Networks, Oct. 27, 2022, 14 pages.

* cited by examiner

300

INTEGRATED ROUTER MODULAR DESIGN WITH MULTI-FUNCTION CONFIGURATIONS

TECHNICAL FIELD

The present disclosure generally relates to networking equipment.

BACKGROUND

Since the early days of networking equipment, network devices have had optical or copper ports that extend to a faceplate on the front. Network devices may include optics/optical cages that connect to an application specific integrated circuit (ASIC). This configuration draws significant amounts of power and has extended length electrical signals between the optics and the ASIC that may barely meet signal integrity requirements. Further complicating an already complex arrangement of network equipment are graphic processing units (GPUs) and data processing units (DPUs) that are being installed in data centers to accommodate rapid progress of artificial intelligence (AI) and machine learning (ML) applications.

DETAILED DESCRIPTION

Overview

Figure 1:
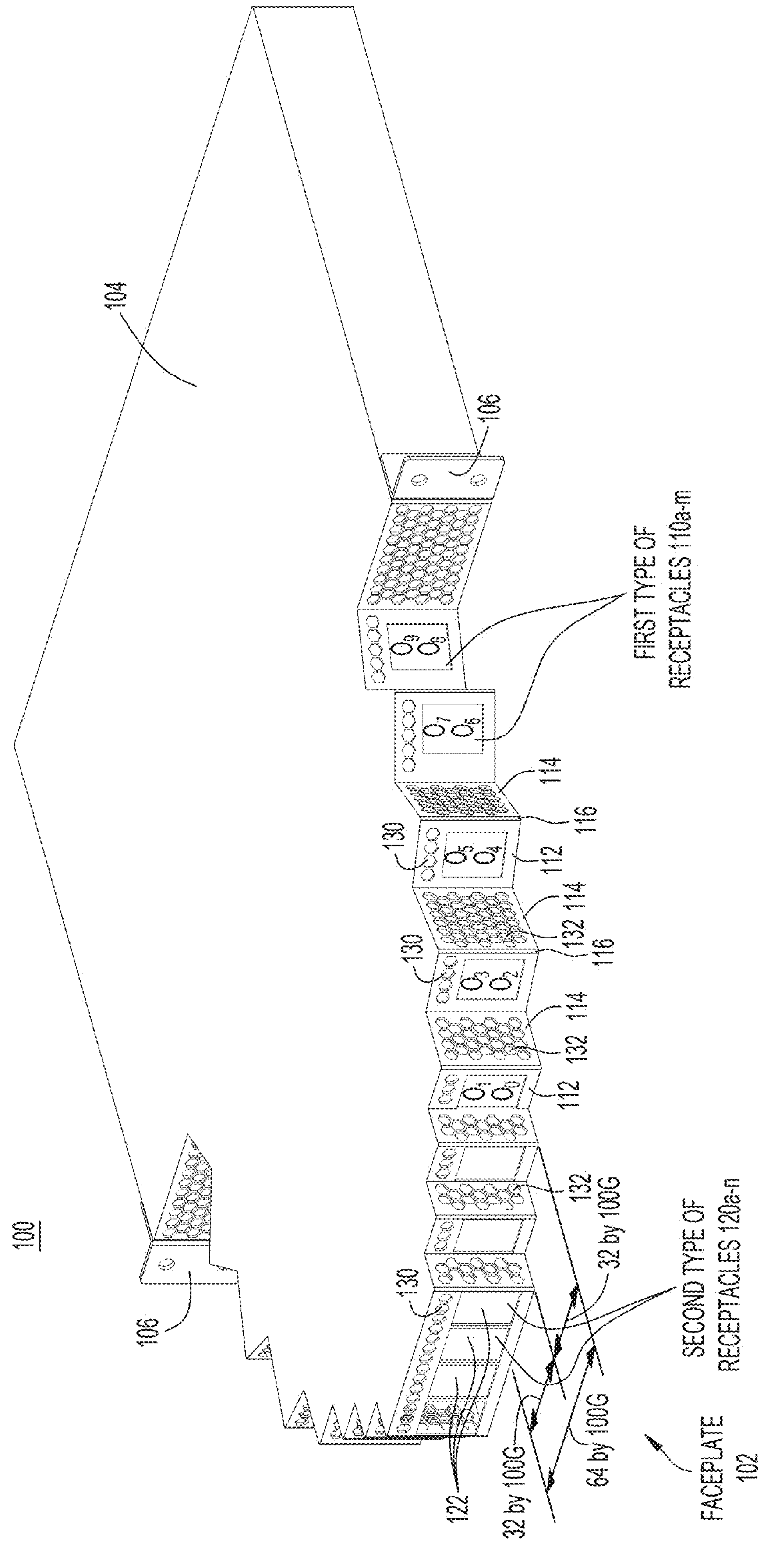
FIG. 1 is a front perspective view of a network device having a plurality of receptacles to interchangeably accommodate AI processor modules or optical transceiver modules, according to an example embodiment.

Methods, apparatuses, and systems provide an integrated router modular design with multi-function configuration such that module cages or receptacles are configured to connect, interchangeably, to an optical transceiver module (i.e., a high powered optical transceiver module) or a processing unit (i.e., a GPU or DPU for performing AI/ML operations).

In one form, a device is provided (e.g., a stackable rack unit (RU)). The device includes a chassis that contains at least one integrated circuit and a faceplate around a portion of the chassis. The faceplate has multiple face portions that expose a plurality of receptacles. At least one receptacle of the plurality of receptacles is a dual purpose receptacle configured to interchangeably receive an optical transceiver module or an artificial intelligence processor module and to enable connectivity with the at least one integrated circuit.

In another form, a method is provided. The method includes positioning at least one integrated circuit into a chassis and positioning a faceplate around a portion of the chassis. The faceplate has multiple face portions that expose a plurality of receptacles. At least one receptacle of the plurality of receptacles is a dual purpose receptacle configured to interchangeably receive an optical transceiver module or an artificial intelligence processor module and to enable connectivity with the at least one integrated circuit. The method further includes inserting the optical transceiver module or the artificial intelligence processor module into the dual purpose receptacle.

In yet another form, a system is provided. The system includes a housing that contains a chassis stack of a plurality of chassis. Each chassis of the plurality of chassis includes at least one integrated circuit and a faceplate around a portion of a respective chassis. The faceplate has multiple face portions that expose a plurality of receptacles. The plurality of receptacles include at least one dual purpose receptacle configured to interchangeably receive an optical transceiver module or an artificial intelligence processor module and to enable connectivity with the at least one integrated circuit and a transceiver receptacle configured to only receive the optical transceiver module.

EXAMPLE EMBODIMENTS

Integration of high power optics modules or high performance, power hungry graphic processing unit (GPU)/data processing unit (DPU)/infrastructure processing units (collectively AI modules or AI processor modules) into a compact router design has not occurred because of various challenges such as very complex power, cooling, and control communications difficulties. Router components, optic interconnects, and/or GPUs/DPUs hosts consume significant power, use excess components, spacing resources, and space within data centers. The GPU/DPU/IPU may be referred to as an AI module or an AI processor module, interchangeably, throughout the disclosure.

AI/ML applications are becoming a commonplace in data centers. High performance computing uses high throughput and low latency transfer of information between compute nodes. Traditionally, a two-tier network may have hosts A and B that send data to a host C. Since two hosts are sending data, congestion may occur on a leaf switch (leaf X) because there is more bandwidth from the spine switch than to the host C and the port connected to host C is oversubscribed. Buffer usage starts building up on the leaf X. After the buffer reaches a weighted random early detection (WRED) minimum threshold, the leaf X starts marking several of the packets' explicit congestion notification (ECN) in an internet protocol (IP) header i.e., ECN field is indicated with a 0x11 value to indicate congestion in the data path.

The techniques presented herein may avoid latency and provide high throughput by having an integrated router modular design in which a plurality of chassis are stacked together forming a chassis stack with direct attach switching fabric detailed below. As such, complex spine/leaf architecture is avoided. As opposed to a traditional design described above, the integrated modular design is physically reduced in size, reduced in power consumption, materials/components, and complexity.

The techniques presented herein may further provide power fault detections with new router concept, 25 Gigabit Ethernet (GE)/40GE Single Pair Ethernet (SPE), an expanded optical module footprint, a liquid cooling assist, and modular one rack unit (RU) removable units. The compact design (i.e., the chassis stack) simplifies on premise AI/ML capability as well as removes several routing layers in an AI cloud network environment.

In one or more example embodiments, the integrated router modular design has a multi-function configuration such that module cages or receptacles are configured to connect, interchangeably, to optical modules (i.e., high powered optical transceiver modules) or processing units (i.e., GPUs or DPUs for performing AI/ML operations). That is, one or more chassis include dual purpose receptacles. A stackable rack unit (RU) has dedicated wide front module cages/receptacles to receive advanced high powered optical modules and/or AI processor modules for AI/ML operations. The stackable RU includes front module cages (front dual purpose receptacles) for plugging in the AI processor modules and/or high powered optical transceiver modules. The AI processing or optical transceiver functionality is included at the very front slot areas. This arrangement may allow for focused deployment of power, cooling, and control plane communications.

The techniques presented herein provide for a dual AI/Optical module auto-negotiation auto-detection i.e., to detect which type of module is plugged in. The techniques presented herein further provide for AI and optic module remote cooling separate from router cooling functions i.e., auxiliary cooling dedicated to an area of dual purpose receptacles. The techniques presented herein may further provide remote power i.e., a separate power assist using high power fault managed power (FMP) wiring with 25GE/40GE SPE GPU/DPU control plane or separate PCIe interconnects. That is, auxiliary FMP power delivery with communications may be provided to the AI processor modules or optical transceiver modules plugged into the dual purpose receptacles. The techniques presented herein may further integrate on premise systems requiring AI processing and transport optics to reduce total power used and required communications components.

According to one or more example embodiments, modular design allows for easy deployment or removal of additional rack units (chassis) and auxiliary power and control base planes that provide additional power (e.g., FMP power), communication, and/or cooling assist.

In this description, a chassis may be referred to as a housing, an enclosure, or a rack unit. As noted above, an artificial intelligence processor module is configured to perform AI processing (machine learning) and may be a GPU, a DPU, or an AI processor. The AI processor module is a pluggable module that has a 52 millimeter (mm) or a 104 mm wide connector that is configured to plug into one of the dual purpose receptacles or cages. For example, the AI processor module may provide 32 by 100GE with the 52 mm connector and may provide 64 by 100GE with 104 mm connector. The optical transceiver module is also a pluggable module configured to perform high speed transmissions to and from components within the chassis e.g., the integrated circuit and AI processor modules. For example, the optical transceiver module may be quad small factor pluggable double density (QSFP-DD) module. The optical transceiver modules also have connectors to plug into the dual purpose receptacles and transceiver receptacles that are dedicated to optical transceiver modules. The optical transceiver module may be referred to as the optical module throughout the disclosure.

Referring now to FIG. 1, FIG. 1 is a front perspective view of a network device 100 having a plurality of receptacles to interchangeably accommodate the AI modules or the optical modules, according to an example embodiment. The network device 100 has a faceplate 102 around a portion of a chassis 104 that includes at least one integrated circuit, and connectors 106 that connect the chassis 104 to a housing (not shown).

The network device 100 is illustrated at a front of the faceplate 102 that follows or traces the outer edges of the receptacles that receive the AI modules or the optical modules. Specifically, the faceplate 102 includes a plurality of first type of receptacles 110*a-m* (transceiver receptacles) that are configured to accommodate only the optical modules and a second type of receptacles 120*a-n* (dual purpose receptacles) that are configured to interchangeably accommodate the AI modules or the optical modules.

The notations 1, 2, 3, . . . n; a, b, c, . . . n; "a-n", "a-d", "a-f", "a-g", "a-k", "a-c", and the like illustrate that the number of elements can vary depending on a particular implementation and is not limited to the number of elements being depicted or described. Moreover, this is only examples of various components, and the number and types of components, functions, etc. may vary based on a particular deployment and use case scenario.

In the network device 100, the AI modules and/or the optical modules are arranged in a semi-circular pattern around an integrated circuit (IC)/an application specific integrated circuit (ASIC) (e.g., around at least portions of three of the sides of the ASIC). The IC is housed in the chassis 104. The AI modules and optical modules are pluggable modules located along a front panel of the network device 100 and each is connected to the IC/ASIC. This arrangement may allow for differential signaling speeds exceeding 112 Gbps (G) and paving the way for 224G/448G signaling rates.

The faceplate 102 includes a plurality of faces or face portions that span along the front and sides. The faceplate 102 includes multiple first front face portions 112 that expose transceiver receptacles for the optical modules (the first type of receptacles 110*a-m*) and multiple second front face portions 122 that expose dual purpose receptacles for the AI/optical modules (the second type of receptacles 120*a-n*). In one example embodiment, the dual purpose receptacles may be of the same dimensions as the transceiver receptacles. In yet another example embodiment, the dual purpose receptacles may be wider than the transceiver receptacles (i.e., wide cages). In yet another example embodiment, the dual purpose receptacles may vary in size e.g., some of the dual purpose receptacles may be of the same size as the transceiver receptacles while other dual purpose receptacles may be twice as wide as the transceiver receptacles. The dimensions of the receptacles depend on a particular deployment and use case scenario.

The first type of receptacles 110*a-m* are exposed on the first front face portions 112 to allow, for example, optical cables to be plugged into the optical modules (not shown). For example, the front face portions include ten adjacent receptacles or adjacent slots i.e., the first type of receptacles 110*a-m* such as $O_0$, $O_1$, $O_2$, $O_3$, $O_4$, $O_5$, $O_6$, $O_7$, $O_8$, and $O_9$. The first type of receptacles 110*a-m* are configured for receiving only the optical modules. As one example, optical modules are pluggable optic transceivers (e.g., 2 by 5 QSFP-DD).

The first front face portions 112 are offset from adjacent first front face portions 112. Side face portions 114 run along the side of plugged in optical modules and connect first front face portions 112 to adjacent first front face portions 112. In other words, the faceplate 102 traces or outlines the outer edges of the modules around the ASIC. Since the optical modules are not in a straight line, the first front face portions 112 are offset from one another. Since the faceplate 102 follows the outer edges of the optical modules, the faceplate 102 surrounds the ASIC in a similar manner as the optical modules. The faceplate 102 includes a plurality of corners 116 where side face portions 114 meet first front face portions 112. By offsetting adjacent face portions, the length of connections to the integrated circuit may be reduced.

The second front face portions 122 include the second type of receptacles 120*a-n* (dual purpose receptacles), which are configured to receive an AI module or an optical module. By providing the second type of receptacles 120*a-n* at the very front slot area, focused deployment of power, cooling, and control plane communications may be accomplished. Further, the second front face portions 122 may also be offset from one another with side face portions having air holes, similar to the first front face portions 112.

By providing the faceplate 102 with this shape/configuration (offset face portions), the openings for inlet air can be increased using not only openings in the front facing walls of the first front face portions 112, but also openings on the side facing walls of the side face portions 114. Front openings 130 provide air inlets to the front of the optical modules and/or AI modules. Side openings 132 provide air inlets to the sides of optical modules. The air flow provided by the front openings 130 and the side openings 132 increase air flow compared to a standard flat faceplate design (without an offset). The increased air flow increases cooling of a network device 100 without adding components such as additional fans or other cooling systems. In addition, power to cooling fans may be reduced without loss of cooling due to the increased air flow provided by the additional air inlet in the non-linear faceplate configuration. Further, since the AI modules are plugged into the dual purpose receptacles at the second front face portions 122, remote cooling separate from cooling functions for the network device 100 may be provided, e.g., auxiliary cooling to an area that may include an AI processor module. Moreover, mesh connections between chassis may replace traditional spine/leaf architecture.

In FIG. 1, a 26 mm wide electrical footprint is scaled to a 52 mm connector with 32 by 100 GE links. Further, the connector and slot may be scaled to 104 mm width, supporting 64 by 100 GE links. As such, the network device 100 may include a total of 3.2 terabits per second (Tbps) or 6.4 Tbps, which is favorable for high performance AI functionality GPU/DPU devices, or dense coherent optical solutions. This configuration is provided by way of an example only and other dimensions/speeds are within the scope of this disclosure.

Figure 2:
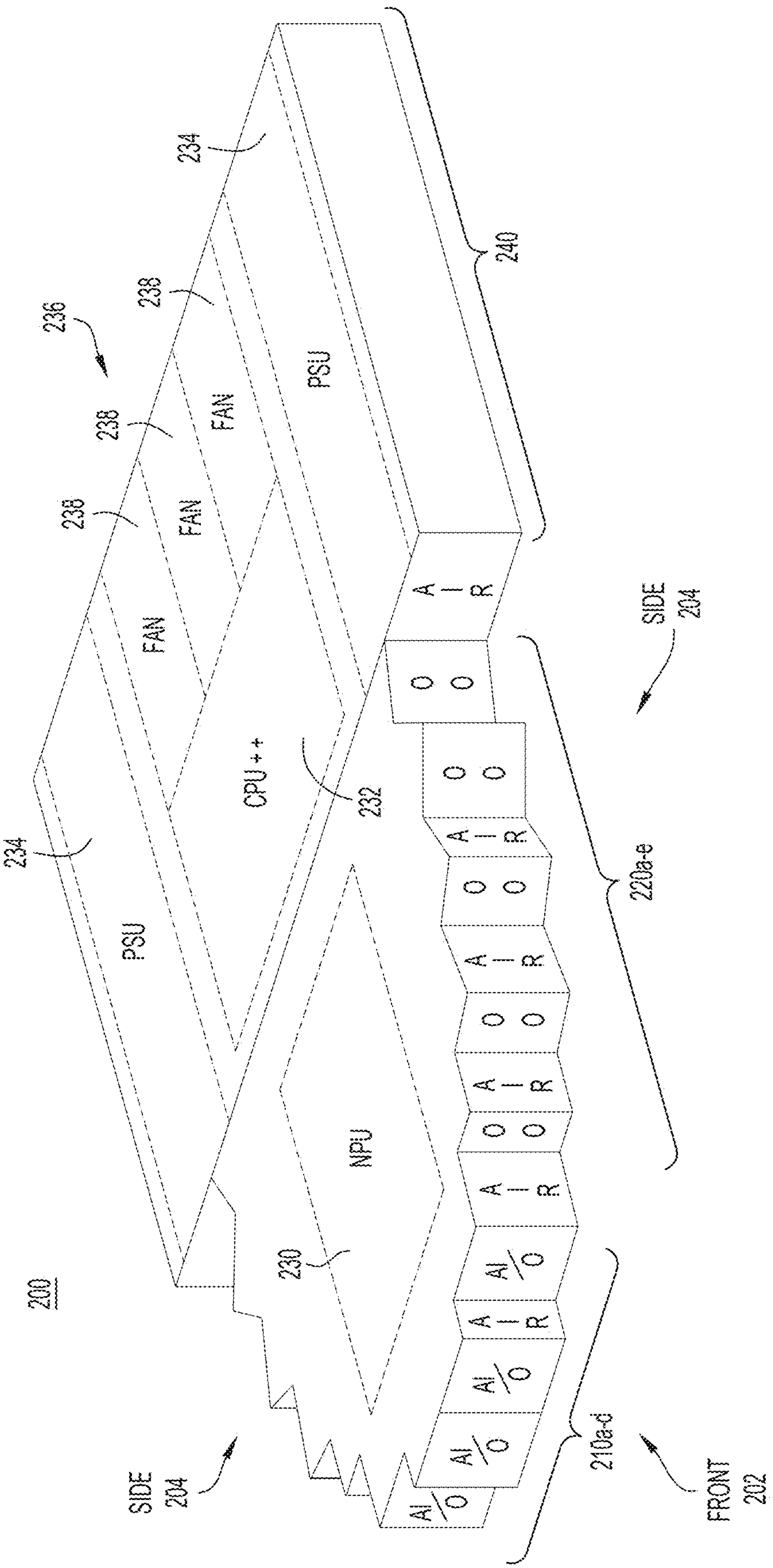
FIG. 2 shows a more complete arrangement of the network device of FIG. 1, but with respect to other components of the network device i.e., a rack unit (RU) structure base configured to accommodate interchangeably an AI processor module or an optical transceiver module, according to an example embodiment.

With continued reference to FIG. 1, reference is now made to FIG. 2. FIG. 2 shows a more complete arrangement of the network device 100 of FIG. 1, but with respect to other components of the network device 100 i.e., a rack unit (RU) structure base 200 (a chassis) configured to accommodate interchangeably an AI processor module or an optical transceiver module, according to an example embodiment.

The rack unit structure base 200 (i.e., the chassis) includes a front face 202 having dual purpose receptacles 210*a-d* that receive AI processor modules (AI modules) or the optical transceiver modules (optical modules) and sides 204 having transceiver receptacles 220*a-e* that receive only the optical modules. The rack unit structure base 200 further includes a network processing unit (NPU 230), a central processing unit (CPU 232) that may further include other components such as an AI CPU, power supply units (PSUs 234), removable fan tray 236 that includes fans 238. These components may be installed on a printed circuit board 240.

In the rack unit structure base 200, the dual purpose receptacles 210*a-d* are included in the very front slot areas (the front face 202). For example, the front face 202 may have four dual modules (AI or optics) plugged therein. In one example embodiment, 32 by 100GE interconnects may be provided to the AI modules. The dual purpose receptacles 210*a-d* are configured to receive a pluggable module and detect whether it is the optical transceiver module or the artificial intelligence processor module when plugged in therein. By concentrating the AI module functionality and/or high powered optics at the front face 202, focused deployment of power, cooling, and control plane communications may be accomplished.

The sides 204 include transceiver receptacles 220*a-e* that may have optical transceiver modules plugged in therein. In at least one example embodiment, the transceiver receptacles 220*a-e* cannot accommodate AI processor modules and are configured to only receive the optical transceiver modules. For example, each of the sides 204 may include five dual optic modules being plugged in therein. By placing the dual purpose receptacles at the front face 202 focused deployment of power, cooling, and control plane communications for the AI modules is accomplished.

In the example illustrated in FIG. 2, the other components include the NPU 230, i.e., an example of an ASIC. The other components further include the CPU 232, which may have other control elements to control operations of the network device, PSUs 234 that supply power to the components of the network device, such as the NPU 230, the CPU 232, and the fans 238. The PSUs 234 and the removable fan tray 236 may be removed from the rack unit structure base 200 from the rear end thereof or from a top portion (i.e., opening a lid) depending on a use case scenario. The fans 238 are configured to cool the network device (e.g., the CPU 232). The fans 238 are just one example of cooling equipment. The fans 238 may include other cooling equipment (e.g., a liquid cooling attachment). The rack unit structure base 200 may further include point of load (POL) power sources next to the CPU and control (not shown for the sake of simplicity).

The AI/optical cages or receptacles are inside the rack unit structure base 200 (i.e., a chassis) and are close to the NPU 230 and/or AI CPU, e.g., to allow for shorter electrical traces (the maximum trace length is 2.5 inches for the receptacles in an inner ring and 4.5 inches in an outer ring). Although not illustrated in FIG. 2, the components in the rack unit structure base 200 are connected to one another with the CPU 232 controlling operations of the components. The rack unit structure base 200 includes cages or receptacles that are not only closer to the NPU 230 but also configured to hold interchangeably AI modules or optical modules (dual purpose receptacles 210*a-d*). These receptacles may be dedicated wide front slots that are configured for high powered optics and/or AI processor modules, reducing power and materials. Moreover, since receptacles are close (partially surround) the NPU 230, shorter electrical traces and the application of linear optic pluggable modules may be used that are much lower power than traditional pluggable optics at 400G and higher electrical signaling rates. In addition, for the configuration illustrated in FIG. 2, a printed circuit board trace loss of 1 dB/inch or less may be achieved by using ultra-low loss printed circuit board material. Further, the dual-purpose receptacles 210*a-d* allow for a dense coherent optical solution and AI processing without using a spine/leaf architecture of related art.

Figure 3:
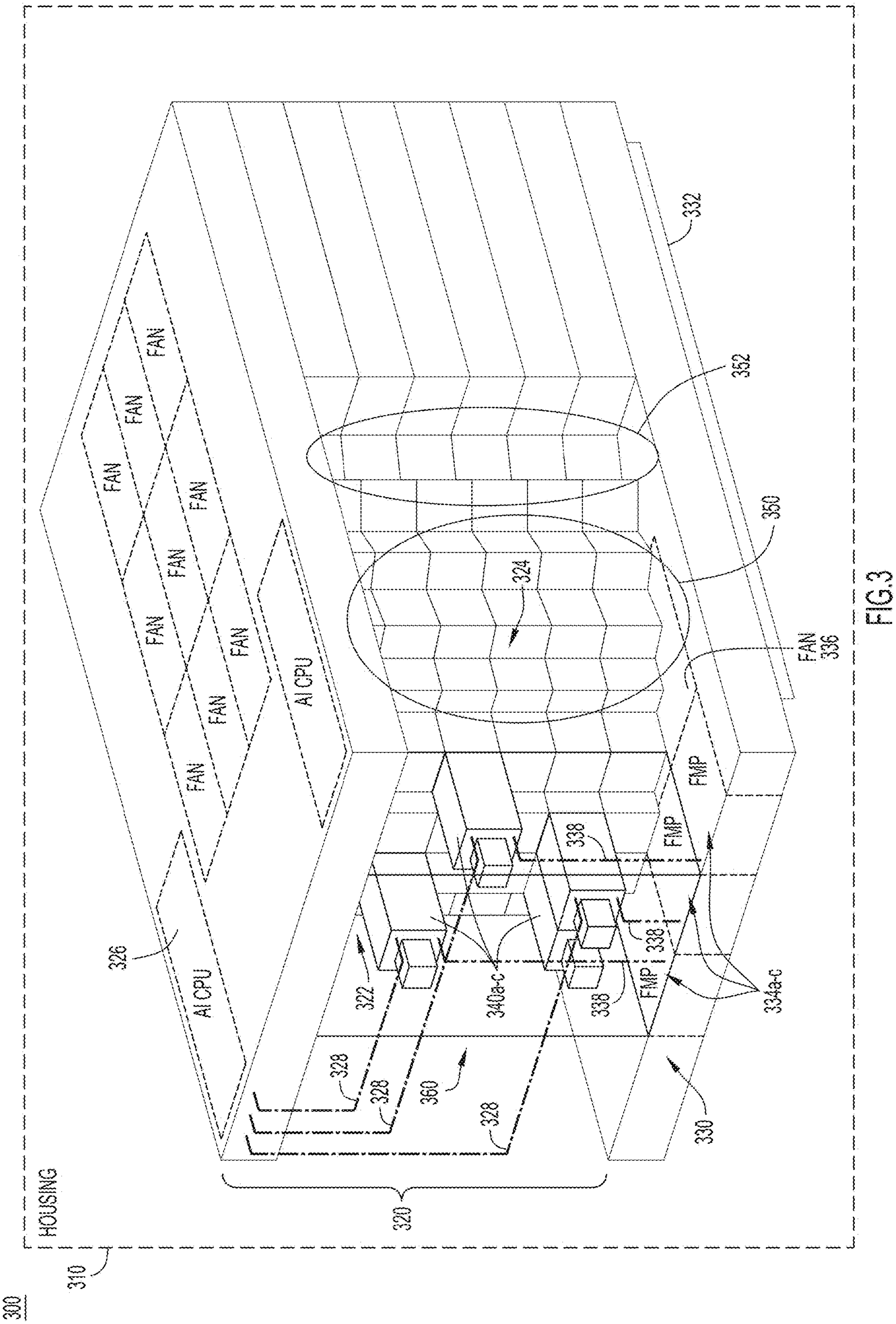
FIG. 3 is a diagram illustrating a system having a separate auxiliary power and control plane communications for AI processor modules in dual purpose receptacles, according to an example embodiment.

With continued reference to FIGS. 1-2, FIG. 3 is a diagram illustrating a system 300 having a separate auxiliary power and control plane communications for AI modules in dual purpose receptacles, according to an example embodiment. The system 300 includes a housing assembly (a housing 310) having a chassis stack 320 of a plurality of chassis and an auxiliary power and control base plane 330 installed on a printed circuit board 332, for example.

In one example embodiment, the system 300 may be a core router that has AI/optic modules and is powered by fault managed power (FMP). The core router has a separate PCIe link to the GPU/DPU modules. In one or more example embodiments, a core router design having FMP power and 25GE SPE interconnection may further be simplified, described below with reference to FIG. 4.

In the housing 310, the chassis stack 320 includes a plurality of chassis (rack units). Each chassis may slide out about 40-45% of the way forward. For example, a chassis may be configured on respective sliding rails in the housing 310 and may slide forward out of the housing 310 to allow a user to access the components therein. As another example, the top may be lifted up and modules (e.g., fan tray, PSUs) may be replaced. The modular arrangement of the chassis stack 320 allows a user to easily remove a 1RU component within 90 seconds or less airtime.

Each chassis in the chassis stack 320 includes a faceplate around a portion of a respective chassis and an integrated circuit. This faceplate has multiple face portions that expose a plurality of receptacles or cages. The plurality of receptacles are configured to receive pluggable modules and include dual purpose receptacles 322 and transceiver receptacles 324. The integrated circuit may include an AI CPU 326.

The dual purpose receptacles 322 are configured to interchangeably receive optical transceiver modules and/or artificial intelligence processor modules and to enable connectivity with the at least one integrated circuit. A dual purpose receptacle detects the optical transceiver module or the artificial intelligence processor module when the pluggable module is plugged into the dual purpose receptacle. As such, some of the dual purpose receptacles 322 may have optical transceiver modules plugged in while others may have AI processor modules plugged in. In the example of FIG. 3, AI processor modules 340*a-c* are plugged into respective ones of the dual purpose receptacles 322. By way of an example, the AI processor modules 340*a-c* may include one wide AI processor module (e.g., 104 mm connector to provide 64 by 100GE) and two standard AI processor modules (e.g., 52 mm connector to provide 32 by 100GE).

The dual purpose receptacles 322 are positioned at a front face of the faceplate. By grouping the dual purpose receptacles 322 at the front face of the faceplate, a direct connection to the integrated circuit may be provided e.g., to a respective AI CPU 326 (as well as power and cooling). A peripheral component interconnect express (PCIe interface 328) may connect a respective AI processor module, plugged into one of the dual purpose receptacles 322, to the respective AI CPU 326. Additionally, the AI CPU 326 may control the plugged in AI processor module using the PCIe interface 328.

The transceiver receptacles 324 are configured to only receive the optical transceiver modules and are not configured to receive the AI processor modules and cannot detect a different type of module e.g., the AI processor module. The transceiver receptacles 324 are positioned on two sides of the faceplate and are configured to connect the optical transceiver modules plugged in therein to an integrated circuit, e.g., an NPU. Additionally, the transceiver receptacles 324 may accommodate high power optical transceiver modules that send processed data to an external device via a cloud, for example.

In one example embodiment, the transceiver receptacles 324 may be split into groups. In the example of FIG. 3, a first group of the transceiver receptacles 324 receive optical transceiver modules that serve as an uplink 350 e.g., for a full mesh to a two core router and a second group of the transceiver receptacles 324 receive optical transceiver modules that serve as a switch link 352 i.e., an on-premise switch access from Internet of Things (IoT) devices such as sensors or cameras that use a large language model (LLM) (AI processing) provided by the AI processor modules 340*a-c*, for example.

The auxiliary power and control base plane 330 on the printed circuit board 332 is configured to provide an auxiliary power and control plane communication for the modules plugged into the dual purpose receptacles 322. That is, the AI processor modules 340*a-c* (and/or optical transceiver modules) may need additional power and cooling for performing resource heavy AI operations (and/or providing a dense coherent optical solution). To provide additional resources that may be used by these modules, the auxiliary power and control base plane 330 includes a plurality of high voltage direct current (HVDC) power supply such as FMP power sources 334*a-c* and a cooling system 336 that may include one or more fans.

In the example of FIG. 3, each of the FMP power sources 334*a-c* is configured to respectively supply FMP power to a respective one of the AI processor modules 340*a-c*, shown at 338. This one-to-one configuration is just an example. In one example embodiment, several FMP power sources may be integrated to power a plugged in module or FMP power provided by one FMP power source may be shared by several plugged in modules. The number, types of components, connections, etc. may vary based on a particular deployment and use case scenario.

The cooling system 336 may include any number of fans to provide air cooling to the modules in the dual purpose receptacles 322 but this is just an example. The cooling system 336 may be a liquid cooling system e.g., a liquid cooling air assist system that is configured to cool the air provided to a cooling cover 360. That is, in the example of FIG. 3, the cooling system 336 is configured to circulate cool air in the cooling cover 360 positioned over the front of the faceplate in which dual purpose receptacles 322 are installed. The cooling cover 360 isolates the front of the faceplate i.e., forms a separate area (environment) for the modules plugged into the dual purpose receptacles 322. The cooling system 336 may be configured to provide air to the cooling cover 360 to cool at least two artificial intelligence processor modules (the AI processor modules 340*a-c* plugged in therein) such that the air exits the cooling cover from a rear end of the housing, detailed below.

With continued reference to FIGS. 1-3, FIG. 4 is a diagram illustrating a system 400 with a direct attach switching fabric and a plurality of stackable auxiliary power and control base planes, according to an example embodiment. The system 400 includes a plurality of stackable auxiliary power and control base planes 410*a-d* (each being similar to the auxiliary power and control base plane 330 of FIG. 3), a plurality of chassis 420*a-f* (e.g., the chassis stack 320 of FIG. 3) having a direct attach switching fabric 430. The system 400 has a front 402 (with a faceplate), sides 404, and a rear end 406. The system 400 incorporates a new router method using the direct attach switching fabric 430. This dense configuration (the arrangement in the system 400) eliminates having complex spine/leaf configurations as this is relatively incorporated into a single configuration i.e., by having the direct attach switching fabric 430.

Each of the plurality of stackable auxiliary power and control base planes 410*a-d* may include a power shelf 412 that provides HVDC (e.g., FMP power) to the modules plugged into dual purpose receptacles and a fan tray 414 that provides cool air into the cooling cover 360. The fan tray 414 may include one or more fans.

Figure 4:
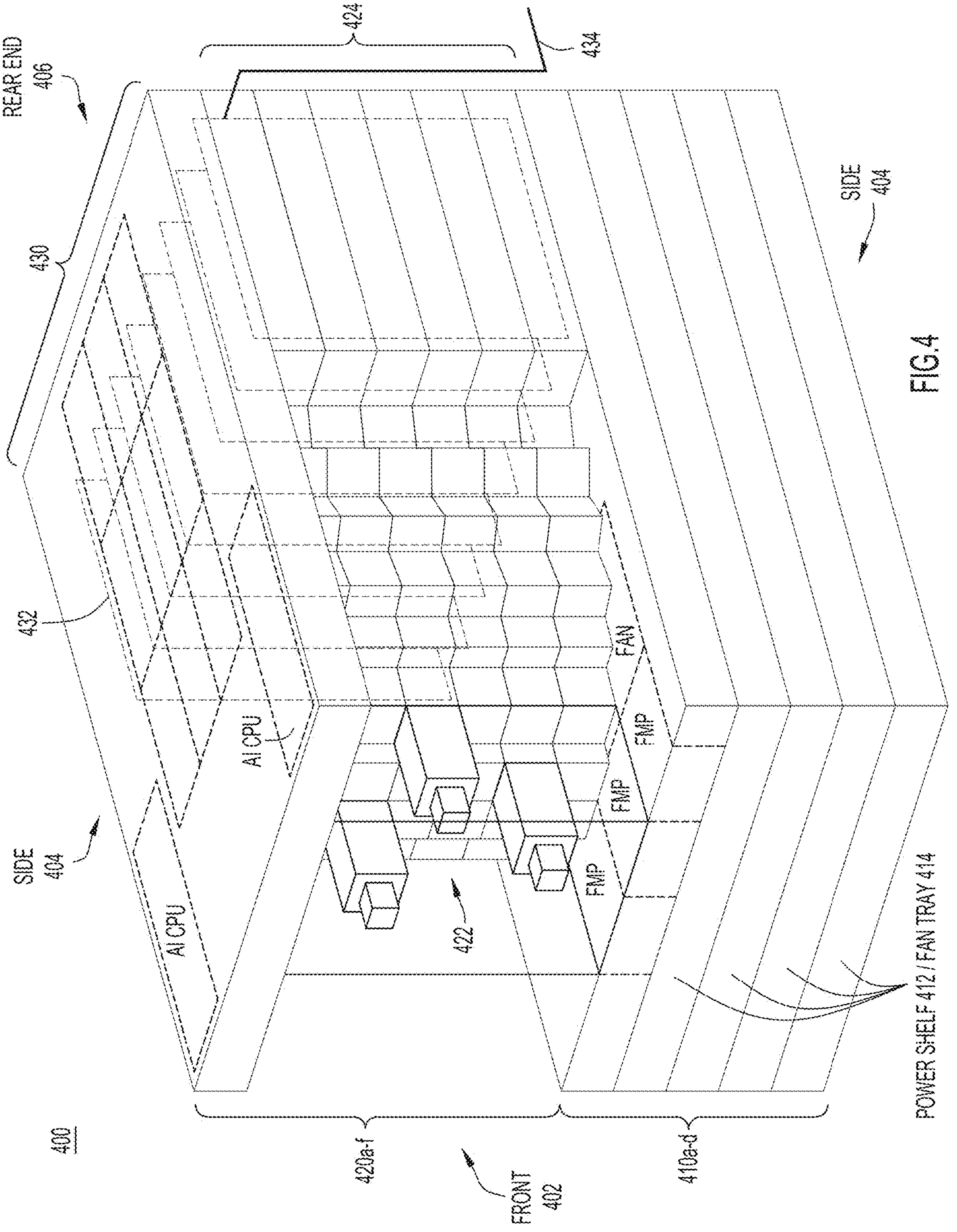
FIG. 4 is a diagram illustrating a system with a direct attach switching fabric and a plurality of stackable auxiliary power and control base planes, according to an example embodiment.

The plurality of chassis 420*a-f* include dual purpose receptacles into which AI processor modules and/or optical transceiver modules may be plugged in. Specifically, the system 400 may include multiple sections 422 at the faceplate at the front 402. Each of the multiple sections 422 has dual purpose receptacles. This is provided by way of an example only, there may be any number of sections that include the dual purpose receptacles e.g., the number of sections may scale from one to eight. In the example of FIG. 4, six sections are shown. The rear end 406 of the plurality of chassis 420*a-f* includes the direct attach switching fabric 430 (in addition to other components such as at least one integrated circuit, power supply units, etc.). By way of an example, the plurality of chassis 420*a-f* include rear fan trays 424 that cool the integrated circuit and other components in a respective chassis.

The direct attach switching fabric 430 includes a plurality of fabric cards 432 configured to provide a mesh of connections between the plurality of chassis 420*a-f*. In the example of FIG. 4, the plurality of fabric cards 432 include eight fabric cards that are orthogonally installed into the plurality of chassis 420*a-f* at the rear end 406 thereof and that provide a mesh of connections. This is just one example, the plurality of fabric cards 432 may be four, six, eight, or another arrangement for the mesh of connections depending on a particular deployment and use case scenario. The direct attach switching fabric 430 further includes a connector 434, e.g., a rear fiber that provides an exit or an external connection to the plurality of fabric cards 432, i.e., connections to external devices and/or to a cloud. The direct attach switching fabric 430 allows for a single configuration as opposed to the spine/leaf architecture. For example, the dual FMP/25GE SPE interconnection (i.e., the direct attach switching fabric 430) may simplify the design or configuration of the system 400.

With continued reference to FIGS. 1-4, FIG. 5 is a diagram illustrating a cooling system 500 in an auxiliary power and control base plane 510 configured to cool an area in which dual purpose receptacles of one or more chassis 520 are installed, according to an example embodiment. The cooling system 500 includes a liquid cooling assist arrangement 512 and a plurality of auxiliary fans 514 in the auxiliary power and control base plane 510, a cooling cover 522 such as the cooling cover 360 of FIG. 3 and a plurality of fans 524 in the one or more chassis 520.

In addition to a plurality of FMP modules 516 in the auxiliary power and control base plane 510, the plurality of auxiliary fans 514 provide air to the cooling cover 522. In other words, the liquid cooling assist arrangement 512 and the plurality of auxiliary fans 514 are components of the cooling system 500 dedicated to cooling AI processor modules and/or optical transceiver modules installed in dual purpose receptacles at the faceplate of the one or more chassis 520.

In one or more example embodiments, the liquid cooling assist arrangement 512 is an arrangement of pipes or tube(s) 552 that circulate cooling fluid for cooling air to be provided to the cooling cover 522. This is just one example and other arrangements which use cooling liquid for auxiliary cooling of air are within the scope of this disclosure.

Figure 5:
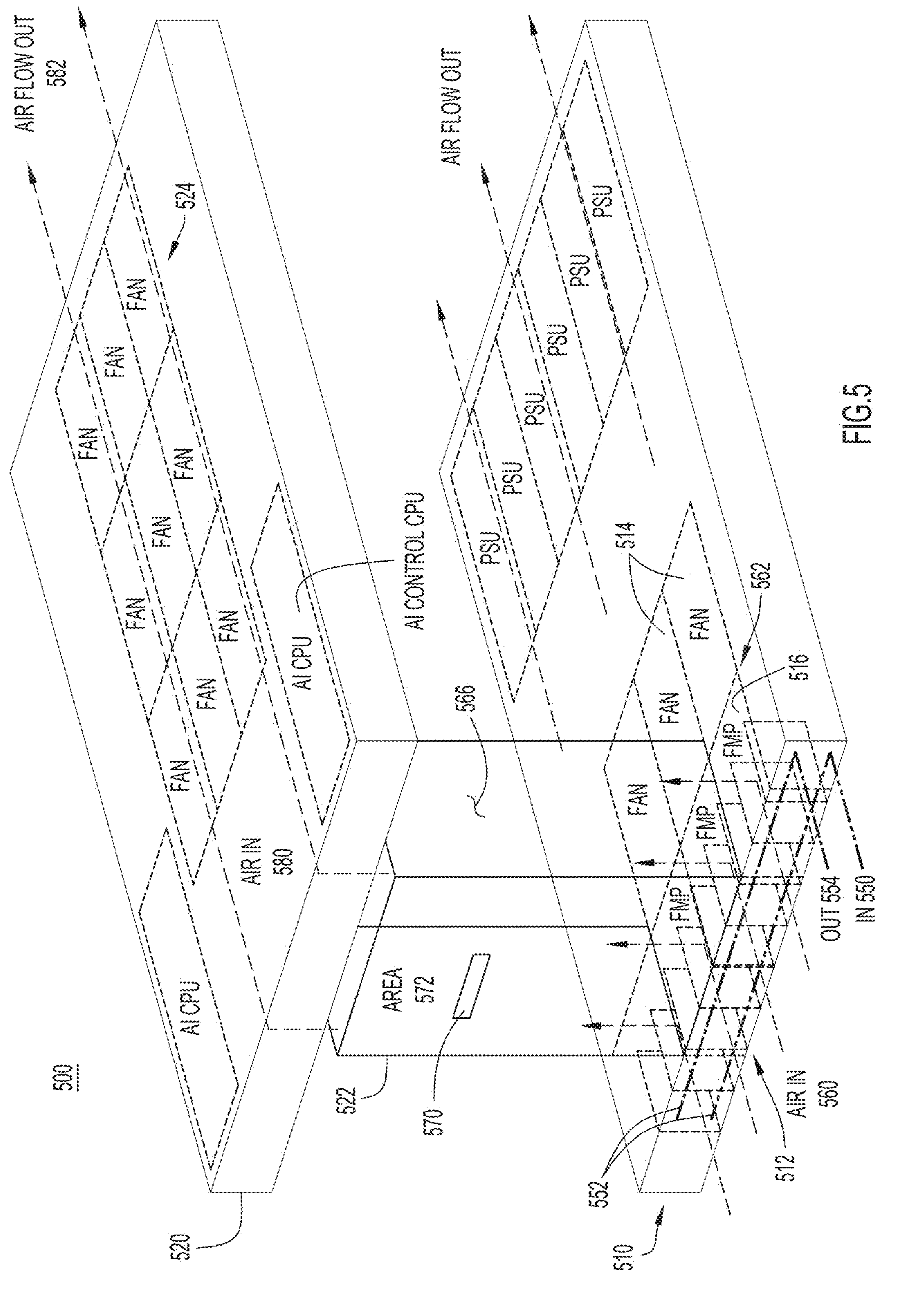
FIG. 5 is a diagram illustrating a cooling system in an auxiliary power and control base plane configured to cool an area in which dual purpose receptacles of one or more chassis are installed, according to an example embodiment.

In FIG. 5, cooling liquid enters at 550, flows through the tube(s) 552 in the auxiliary power and control base plane 510 and exits the tube(s) 552 at 554. The tube(s) 552 may be positioned near or align with the plurality of auxiliary fans 514 to cool the air being provided from the outside to the plurality of auxiliary fans 514. In yet another example embodiment, the tube(s) 552 may be positioned such that air from the plurality of auxiliary fans 514 is cooled prior to entering the cooling cover 522.

Specifically, at 560, outside air enters the auxiliary power and control base plane 510 through one or more holes or openings e.g., front openings. The air is cooled by the liquid cooling assist arrangement 512 i.e., passes between the tube(s) 552 and approaches the plurality of auxiliary fans 514, at 562. The plurality of auxiliary fans 514 blow the air into the cooling cover 522. That is, the cooled air exits the auxiliary power and control base plane 510 and enters the cooling cover 522 of the one or more chassis 520, at 564.

The cooling cover 522 may be a housing or a cover over the AI/optics modules plugged into the dual purpose receptacles. The cooling cover 522 is configured to form an area 572 around the front of the faceplate with one or more AI/optic modules inserted therein. This arrangement may provide superior cooling to the AI processor modules such as GPUs and DPUs and/or high power optical transceiver modules (AI/optic modules) that are plugged into the dual purpose receptacles. This arrangement, however, does not provide direct liquid cooling to the AI/optic modules and instead super cools the area 572 in which the AI/optic modules are installed, shown at 566. The air exits the cooling cover 522 at sides thereof and/or at a rear end of the one or more chassis 520, at 568. In one example embodiment, the air may exit at a top of the one or more chassis 520. In one or more example embodiments, cold plates 570 may be added to the area 572 formed by the cooling cover 522. As such, air circulating in the cooling cover 522 is further cooled by the cold plates 570.

An additional or main airflow to cool other components of the one or more chassis 520 such as the ones described in FIG. 2 (e.g., AI CPU, CPU, etc.) is also provided. The main airflow is configured to provide cooling to the components in the one or more chassis 520 including the integrated circuit or ASIC therein. For example, the air enters at the faceplate i.e., at a front of the one or more chassis 520, shown at 580, circulates through the one or more chassis 520 and exits at the rear end of the one or more chassis 520, shown at 582. The main air flow is facilitated by the plurality of fans 524. Moreover, the offset configuration of the receptacles allows for greater air intake for enhanced cooling.

With continued reference to FIGS. 1-5, FIG. 6 is a diagram illustrating an on-premise AI application system 600 that processes image data from one or more cameras and outputs results to a dashboard, according to an example embodiment. The on-premise AI application system 600 includes IoT devices 610, a switch 620, a network device 630 such as the network device 100 of FIG. 1, a cloud 640, and a dashboard 650. The cloud 640 and the dashboard 650 are just examples of outputting data processed by the network device 630 and other external systems/networks are within the scope of this disclosure.

The IoT devices 610 may include a plurality of data gathering devices such as cameras that gather image data or sensors that collect sensed data that is to be processed by an AI application or an AI tool. At 612, the IoT devices 610 send gathered data to the network device 630, via the switch 620.

The network device 630 executes an AI application using one or more AI processor modules 632 such as the AI processor modules 340*a-c* of FIG. 3. That is, the network device 630 receives input data via optical transceiver modules e.g., inserted into a first group of transceiver receptacles 634*a*. At 636, the network device 630 performs machine learning (AI processing) of the input/received data using the AI processor modules 632 e.g., GPUs and/or DPUs. For example, the network device 630 may execute a large language model (LLM) to analyze image data from a plurality of cameras.

Figure 6:
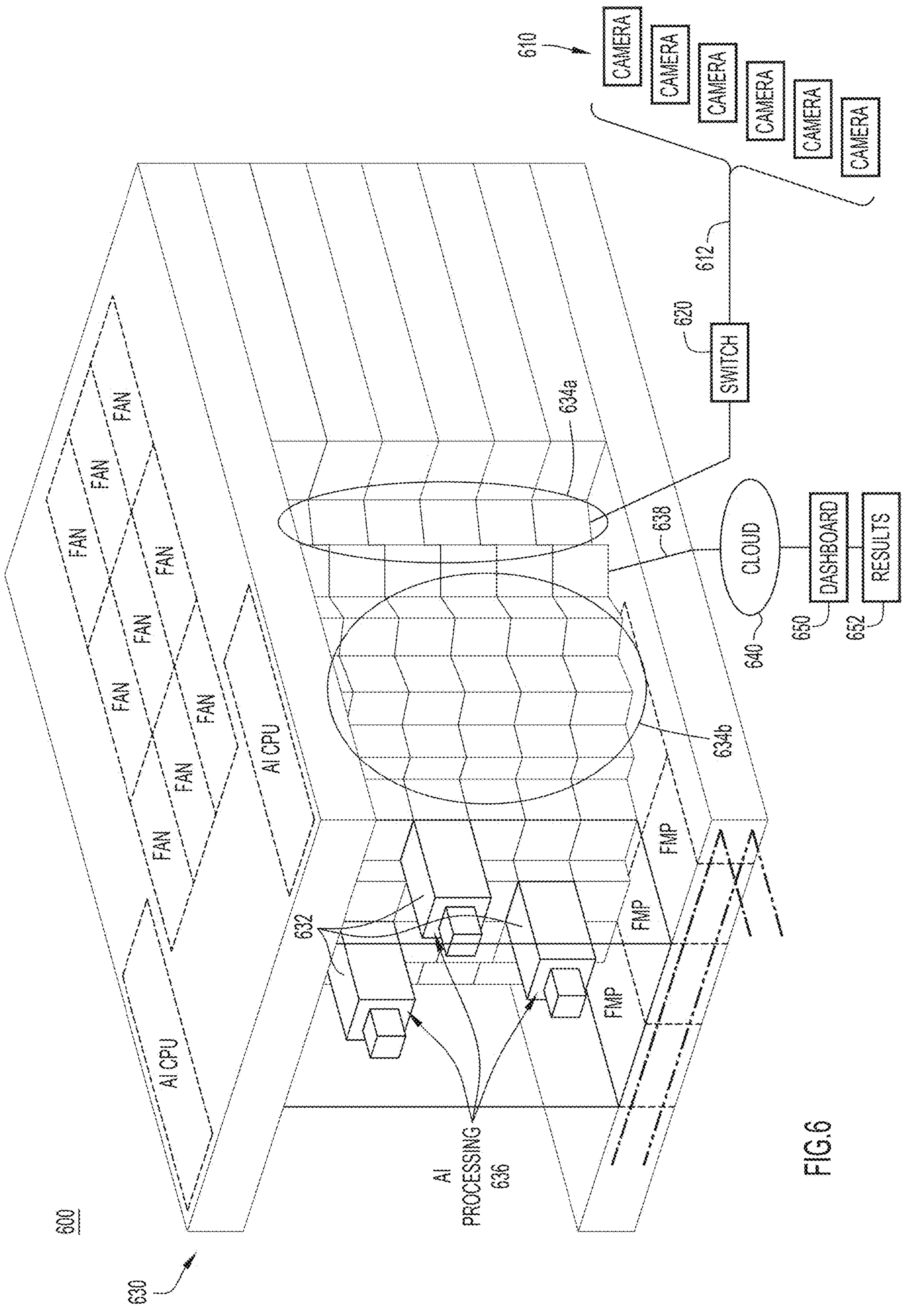
FIG. 6 is a diagram illustrating an on-premise AI application system that processes image data from one or more cameras and outputs results to a dashboard, according to an example embodiment.

At 638, the network device 630 transmits the processed data (results) via optical transceiver modules e.g., inserted into a second group of transceiver receptacles 634*b*, via a cloud 640 (i.e., network), to the dashboard 650. At 652, the dashboard 650 outputs results to a user displayed on a user interface. This, however, is just an example. The processed data may be provided via a network to a backend application such as a network management service that may further analyze and/or process the data to determine whether to output an alert, etc. The example of FIG. 6 illustrates the simplicity of providing an on-premise AI application for camera or other processing without using multiple rack locations of routers and separate AI systems.

Figure 7:
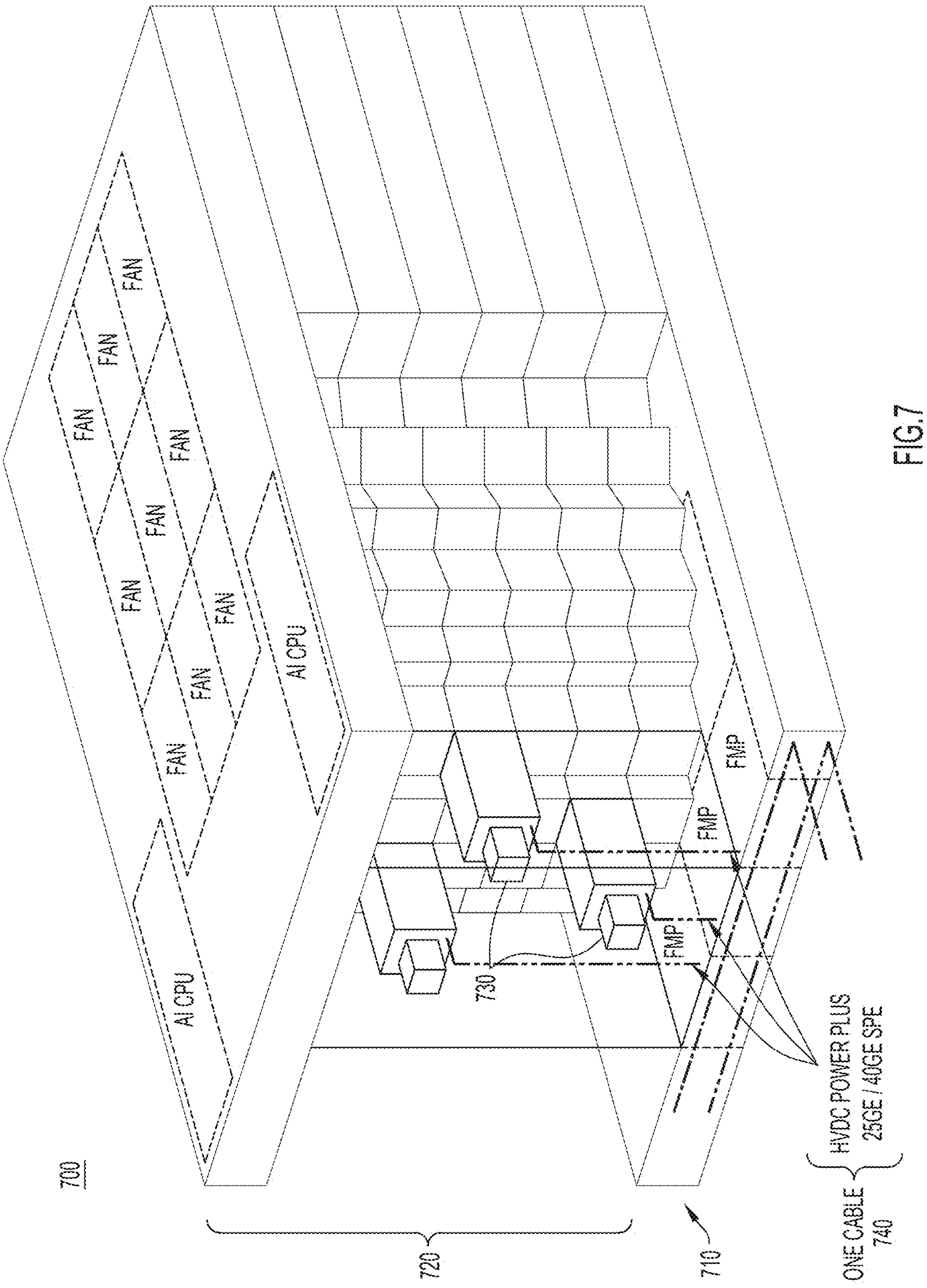
FIG. 7 is a diagram illustrating a network device in which AI processor modules and/or optical transceiver modules inserted into dual purpose receptacles are provided with integrated power, communication and cooling, according to an example embodiment.

FIG. 7 is a diagram illustrating a network device 700 in which artificial intelligence processor modules and/or optical transceiver modules inserted into dual purpose receptacles are provided with an integrated power, communication and cooling, according to an example embodiment. The network device 700 includes an auxiliary power and control base plane 710, a chassis stack 720 into which AI processor modules and/or optical modules (AI/optical modules 730) are inserted. Additionally, each of the AI/optical modules 730 is connected to the auxiliary power and control base plane 710 via a cable 740.

The AI/optical modules 730 are connected to FMP power, communication, and cooling via the cable 740. That is, a single cable (the cable 740) is configured to provide high voltage direct current (HVDC) power (e.g., FMP power) and 25GE or 40GE SPE communication. Moreover, direct cooling may be provided via the cable 740. For example, the FMP application is with SPE to deliver 1000 watts or more to an AI processor module or optical transceiver module or other high power application needing large amounts of power and cooling that typically may not be delivered from the router itself (i.e., the chassis stack 720). This configuration allows for colder air at the AI/optical modules 730 to the sides of this router configuration, allowing for higher power QSFP-DD or optic modules beyond 100 watts.

The techniques presented herein provide a network device such as a multi one rack unit (RU) stackable router design with dedicated wide front module cages (dual purpose receptacles) for advanced high voltage optics and GPU/DPU modules. In addition, the techniques described herein allow for forced air cooling and/or auxiliary liquid cooling specific to these pluggable models (without direct cooling) and support power delivery significantly beyond 2000 watts as may be used by AI applications. The arrangement(s) provided herein allow for focused deployment of power, cooling, and control plane communications e.g., via a single cable. The techniques presented herein reduce power consumption and the number of communication components.

Figure 8:
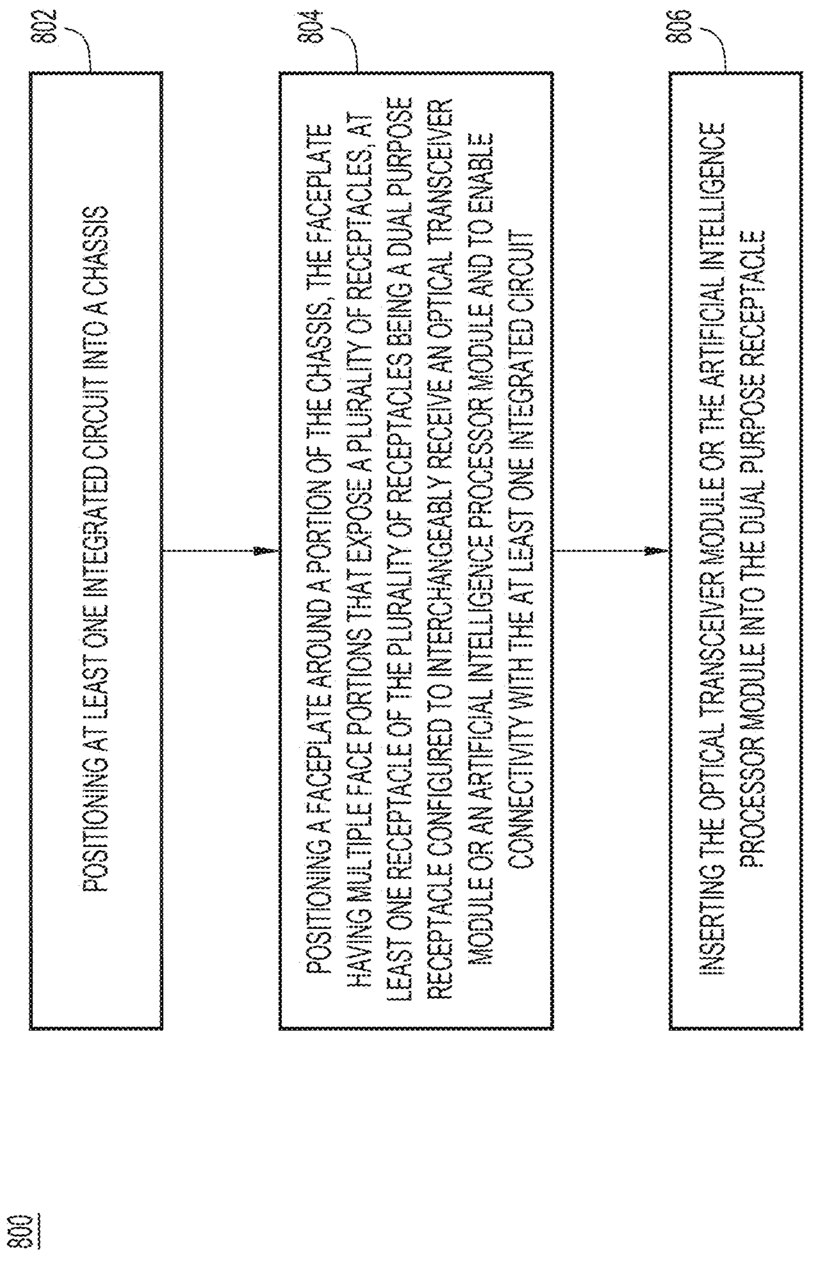
FIG. 8 is a flow diagram illustrating a method of creating a device with short signal traces, reduced power consumption, and improved cooling, according to an example embodiment.

Reference is now made to FIG. 8. FIG. 8 is a flow diagram illustrating a method 800 of creating a chassis with dual purpose receptacles for inserting an optical transceiver module or an artificial intelligence module, according to an example embodiment.

At 802, at least one integrated circuit is positioned into a chassis. At 804, a faceplate is positioned around a portion of the chassis. The faceplate has multiple face portions that expose a plurality of receptacles. At least one receptacle of the plurality of receptacles is a dual purpose receptacle configured to interchangeably receive an optical transceiver module or an artificial intelligence processor module and to enable connectivity with the at least one integrated circuit.

At 806, the optical transceiver module or the artificial intelligence processor module is inserted into the dual purpose receptacle.

In one form, the operation 804 of positioning the faceplate around the portion of the chassis may include positioning the plurality of receptacles around two or more sides of the at least one integrated circuit and connecting high voltage power to the optical transceiver module or the artificial intelligence processor module inserted into the dual purpose receptacle.

In another form, the operation 804 of positioning the faceplate around the portion of the chassis may include positioning the plurality of receptacles around two or more sides of the at least one integrated circuit and connecting fault managed power (FMP) to the optical transceiver module or the artificial intelligence processor module inserted into the dual purpose receptacles.

In yet another form, the operation 804 of positioning the faceplate around the portion of the chassis may include positioning a first set of dual purpose receptacles at a front face of the faceplate and detecting the optical transceiver module or the artificial intelligence processor module when plugged in therein.

In one instance, the operation 804 of positioning the faceplate around the portion of the chassis may further include positioning a second set of receptacles on two sides of the faceplate and receiving only the optical transceiver module in each of the second set of receptacles.

According to one or more example embodiments, the method 800 may further include providing fault managed power (FMP) using an auxiliary power and control base plane to a plurality of dual purpose receptacles of the plurality of receptacles. The method 800 may further include inserting at least two artificial intelligence processor modules into the plurality of dual purpose receptacles.

Figure 9:
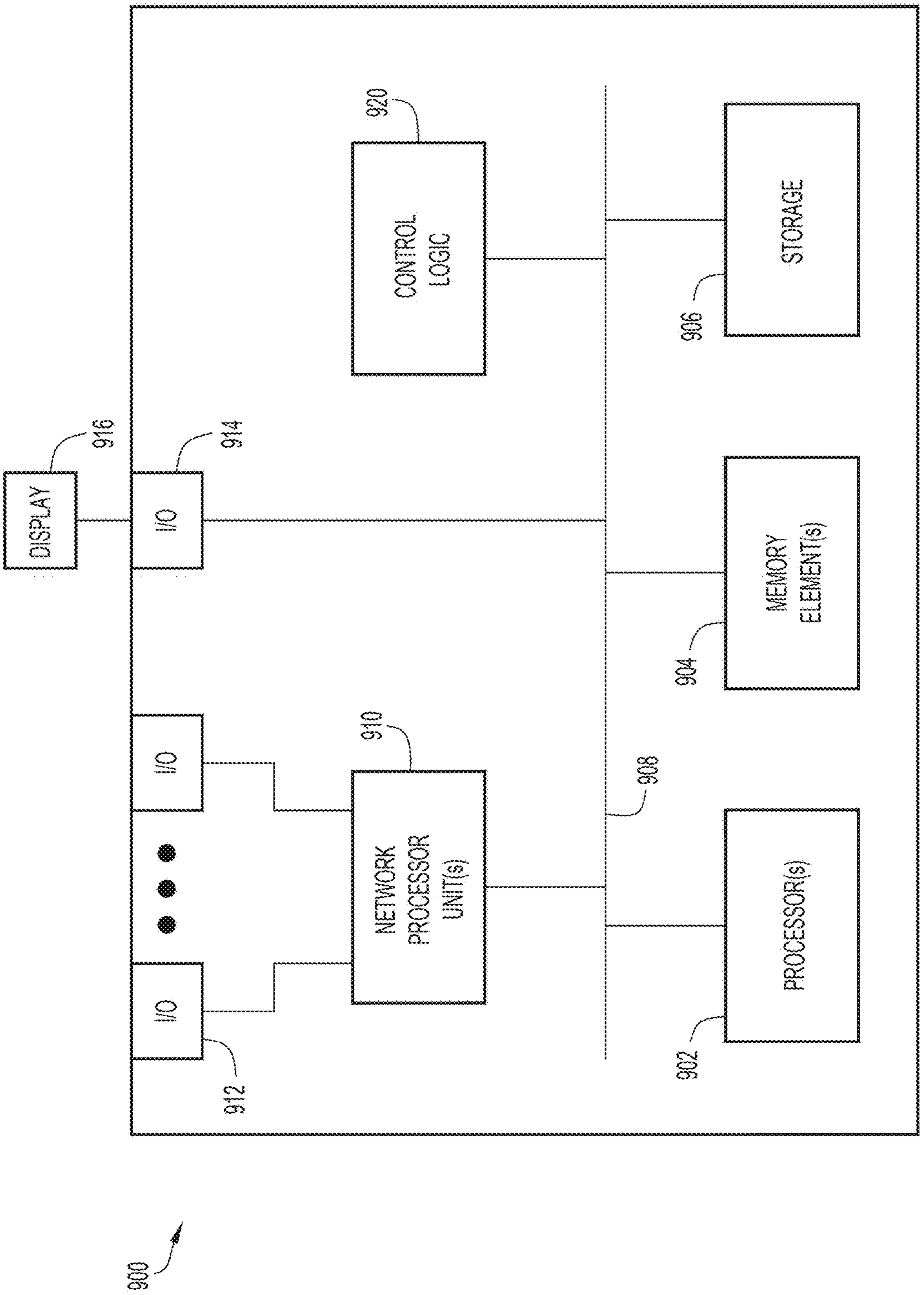
FIG. 9 is a hardware block diagram of a computing device or a network device that may perform functions associated with any combination of operations in connection with the techniques depicted and described in FIGS. 1-8, according to various example embodiments.

FIG. 9 is a hardware block diagram of a computing device 900 that may perform functions associated with any combination of operations in connection with the techniques depicted and described in FIGS. 1-8, according to various example embodiments. The computing device 900 may be a network device that hosts various components to perform at least some of the computing functions. The computing device 900 may be a server that executes an application that provides a dashboard or a user device that gathers data for AI processing. It should be appreciated that FIG. 9 provides only an illustration of one embodiment and does not imply any limitations with regard to the environments in which different embodiments may be implemented. Many modifications to the depicted environment may be made.

In at least one embodiment, computing device 900 may include one or more processor(s) 902, one or more memory element(s) 904, storage 906, a bus 908, one or more network processor unit(s) 910 interconnected with one or more network input/output (I/O) interface(s) 912, one or more I/O interface(s) 914, and control logic 920. In various embodiments, instructions associated with logic for computing device 900 can overlap in any manner and are not limited to the specific allocation of instructions and/or operations described herein.

In at least one embodiment, processor(s) 902 is/are at least one hardware processor configured to execute various tasks, operations and/or functions for computing device 900 as described herein according to software and/or instructions configured for computing device 900. Processor(s) 902 (e.g., a hardware processor) can execute any type of instructions associated with data to achieve the operations detailed herein. In one example, processor(s) 902 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, one or more memory element(s) 904 and/or storage 906 is/are configured to store data, information, software, and/or instructions associated with computing device 900, and/or logic configured for memory element(s) 904 and/or storage 906. For example, any logic described herein (e.g., control logic 920) can, in various embodiments, be stored for computing device 900 using any combination of memory element(s) 904 and/or storage 906. Note that in some embodiments, storage 906 can be consolidated with one or more memory elements 904 (or vice versa), or can overlap/exist in any other suitable manner.

In at least one embodiment, bus 908 can be configured as an interface that enables one or more elements of computing device 900 to communicate in order to exchange information and/or data. Bus 908 can be implemented with any architecture designed for passing control, data and/or information between processors, memory elements/storage, peripheral devices, and/or any other hardware and/or software components that may be configured for computing device 900. In at least one embodiment, bus 908 may be implemented as a fast kernel-hosted interconnect, potentially using shared memory between processes (e.g., logic), which can enable efficient communication paths between the processes.

In various embodiments, network processor unit(s) 910 may enable communication between computing device 900 and other systems, entities, etc., via network I/O interface(s) 912 to facilitate operations discussed for various embodiments described herein. In various embodiments, network processor unit(s) 910 can be configured as a combination of hardware and/or software, such as one or more Ethernet driver(s) and/or controller(s) or interface cards, Fibre Channel (e.g., optical) driver(s) and/or controller(s), and/or other similar network interface driver(s) and/or controller(s) now known or hereafter developed to enable communications between computing device 900 and other systems, entities, etc. to facilitate operations for various embodiments described herein. In various embodiments, network I/O interface(s) 912 can be configured as one or more Ethernet port(s), Fibre Channel ports, and/or any other I/O port(s) now known or hereafter developed. Thus, the network processor unit(s) 910 and/or network I/O interface(s) 912 may include suitable interfaces for receiving, transmitting, and/or otherwise communicating data and/or information in a network environment.

I/O interface(s) 914 allow for input and output of data and/or information with other entities that may be connected to computing device 900. For example, I/O interface(s) 914 may provide a connection to external devices such as a keyboard, keypad, a touch screen, and/or any other suitable input device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor 916, a display screen, or the like.

In various embodiments, control logic 920 can include instructions that, when executed, cause processor(s) 902 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

In another example embodiment, an apparatus or a device is provided. The device includes a chassis that contains at least one integrated circuit. The device further includes a faceplate around a portion of the chassis. The faceplate has multiple face portions that expose a plurality of receptacles. At least one receptacle of the plurality of receptacles is a dual purpose receptacle configured to interchangeably receive an optical transceiver module or an artificial intelligence processor module and to enable connectivity with the at least one integrated circuit.

In one form, the plurality of receptacles may be positioned around two or more sides of the at least one integrated circuit and may be configured to connect high voltage power to the optical transceiver module or the artificial intelligence processor module, which are pluggable modules.

In another form, the plurality of receptacles may be positioned around two or more sides of the at least one integrated circuit and may be configured to connect fault managed power (FMP) to the optical transceiver module or the artificial intelligence processor module, which are pluggable modules.

In yet another form, the plurality of receptacles may include a first set of dual purpose receptacles that are positioned at a front face of the faceplate and are configured to detect the optical transceiver module or the artificial intelligence processor module when plugged in therein.

In one instance, the plurality of receptacles may include a second set of receptacles that are positioned on two sides of the faceplate and are configured to only receive the optical transceiver module.

According to one or more example embodiments, the multiple face portions may include front face portions and side face portions. Each front face portion may be offset from each adjacent front face portion and may expose the dual purpose receptacle. A side face portion may connect a front face portion to an adjacent front face portion.

According to one or more example embodiments, the plurality of receptacles may include a plurality of dual purpose receptacles positioned at a front of the faceplate and may be configured to receive at least two artificial intelligence processor modules. The device may further include a housing that includes the chassis and a printed circuit board that includes an auxiliary power and control base plane that provides fault managed power (FMP) to the plurality of dual purpose receptacles for the at least two artificial intelligence processor modules.

In one form, the at least one integrated circuit may include an artificial intelligence central processing unit (AI CPU). The housing may further include a communication interface that is integrated with fault managed power and is configured to connect the at least two artificial intelligence processor modules to the AI CPU.

In another form, at least one integrated circuit may include an artificial intelligence central processing unit (AI CPU). The housing may further include a communication interface configured to connect the at least two artificial intelligence processor modules to the AI CPU.

In one instance, the housing may further include a cooling cover positioned over the front of the faceplate in which dual purpose receptacles are installed. The auxiliary power and control base plane may further include a cooling system configured to provide air to the cooling cover to cool the at least two artificial intelligence processor modules plugged in therein such that the air exits the cooling cover from a rear end of the housing.

In another instance, the auxiliary power and control base plane may further include a liquid cooling air assist system that is configured to cool the air provided to the cooling cover.

In yet another instance, the device may further include at least one power supply, positioned in the housing, that powers the at least one integrated circuit and is configured to power a plurality of optical transceiver modules plugged into at least two of the plurality of receptacles other than the dual purpose receptacle.

According to one or more example embodiments, the device may further include a housing that includes the chassis and at least one additional chassis that contains at least one additional integrated circuit and at least one additional faceplate with another plurality of receptacles including at least one additional dual purpose receptacle.

In one form, the device may further include a plurality of fabric cards configured to provide a mesh of connections between the chassis and the at least one additional chassis.

In another form, the device may further include a plurality of stackable auxiliary power and control base planes that provide fault managed power (FMP) to a plurality of dual purpose receptacles for at least two artificial intelligence processor modules.

In yet another example embodiment, a system is provided. The system includes a housing that contains a chassis stack of a plurality of chassis. Each chassis of the plurality of chassis includes at least one integrated circuit and a faceplate around a portion of a respective chassis. The faceplate has multiple face portions that expose a plurality of receptacles. The plurality of receptacles include at least one dual purpose receptacle configured to interchangeably receive an optical transceiver module or an artificial intelligence processor module and to enable connectivity with the at least one integrated circuit and a transceiver receptacle configured to only receive the optical transceiver module.

In one form, the system may further include a switch configured to provide data from at least one external device to a plurality of artificial intelligence processor modules plugged into respective ones of dual purpose receptacles in the chassis stack via a plurality of optical transceiver modules plugged into respective receptacles of the dual purpose receptacles and transceiver receptacles in the chassis stack.

In one instance, the system may further include the plurality of optical transceiver modules that provide processed data from the plurality of artificial intelligence processor modules to a cloud.

In another instance, the system may further include a cooling cover positioned over a front of a plurality of faceplates of the chassis stack, in which dual purpose receptacles are installed.

According to one or more example embodiments, the system may further include at least one auxiliary power and control base plane, each including a cooling system configured to provide air to the cooling cover to cool at least two artificial intelligence modules plugged in therein such that the air exits the cooling cover from a rear end of the housing.

In yet another example embodiment, an arrangement may be provided that includes the devices and operations explained above with reference to FIGS. 1-9.

The programs described herein (e.g., control logic 920) may be identified based upon the application(s) for which they are implemented in a specific embodiment. However, it should be appreciated that any particular program nomenclature herein is used merely for convenience, and thus the embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, the storage 906 and/or memory elements(s) 904 can store data, software, code, instructions (e.g., processor instructions), logic, parameters, combinations thereof, and/or the like used for operations described herein. This includes the storage 906 and/or memory elements(s) 904 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™, mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may be directly or indirectly connected utilizing any algorithms, communication protocols, interfaces, etc. (proprietary and/or non-proprietary) that allow for the exchange of data and/or information.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combinations of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A device comprising:

a chassis that contains at least one integrated circuit; and a faceplate around a portion of the chassis, the faceplate having multiple face portions that expose a plurality of receptacles, at least one receptacle of the plurality of receptacles being a dual purpose receptacle configured to interchangeably receive an optical transceiver module or an artificial intelligence processor module and to enable connectivity with the at least one integrated circuit.

2. The device of claim 1, wherein the plurality of receptacles are positioned around two or more sides of the at least one integrated circuit and are configured to connect high voltage power to the optical transceiver module or the artificial intelligence processor module, which the optical transceiver module or the artificial intelligence processor module is each a pluggable module.

3. The device of claim 1, wherein the plurality of receptacles are positioned around two or more sides of the at least one integrated circuit and are configured to connect fault managed power to the optical transceiver module or the artificial intelligence processor module, which the optical transceiver module or the artificial intelligence processor module is each a pluggable module.

4. The device of claim 1, wherein the plurality of receptacles include a first set of dual purpose receptacles including the dual purpose receptacle that are positioned at a front face of the multiple face portions of the faceplate and are configured to detect the optical transceiver module or the artificial intelligence processor module when plugged in therein.

5. The device of claim 4, wherein the plurality of receptacles include a second set of receptacles that are positioned on two side face portions of the multiple face portions of the faceplate and are configured to only receive the optical transceiver module.

6. The device of claim 1, wherein the multiple face portions include front face portions and side face portions, wherein each of the front face portions is offset from an adjacent one of the front face portions and exposes the dual purpose receptacle, and wherein a respective one of the side face portions connects a respective one of the front face portions to the adjacent one of the front face portions.

7. The device of claim 1, wherein the at least one receptacle of the plurality of receptacles being a dual purpose receptacle is two or more receptacles of the plurality of receptacles being a plurality of dual purpose receptacles, wherein the plurality of dual purpose receptacles are positioned at a front of the faceplate, and the plurality of the dual purpose receptacles are configured to receive at least two artificial intelligence processor modules, and further comprising:

a housing that includes the chassis and a printed circuit board that includes an auxiliary power and control base plane that provides fault managed power (FMP) to the plurality of dual purpose receptacles for the at least two artificial intelligence processor modules.

8. The device of claim 7, wherein the at least one integrated circuit includes an artificial intelligence central processing unit (AI CPU), and wherein the housing further includes:

a communication interface that is integrated with the FMP and is configured to connect the at least two artificial intelligence processor modules to the AI CPU.

9. The device of claim 7, wherein the at least one integrated circuit includes an artificial intelligence central processing unit (AI CPU), and wherein the housing further includes:

a communication interface configured to connect the at least two artificial intelligence processor modules to the AI CPU.

10. The device of claim 7, wherein the housing further includes a cooling cover positioned over the front of the faceplate in which the dual purpose receptacles are installed, and wherein the auxiliary power and control base plane further includes a cooling system configured to provide air to the cooling cover to cool the at least two artificial intelligence processor modules plugged in therein such that the air exits the cooling cover from a rear end of the housing.

11. The device of claim 10, wherein the auxiliary power and control base plane further includes a liquid cooling air assist system that is configured to cool the air provided to the cooling cover.

12. The device of claim 11, further comprising:

at least one power supply, positioned in the housing, that powers the at least one integrated circuit and is configured to power a plurality of the optical transceiver modules plugged into at least two of the plurality of receptacles other than any of the dual purpose receptacles.

13. The device of claim 1, further comprising:

a housing that includes the chassis and at least one additional chassis, the at least one additional chassis contains at least one additional integrated circuit and at least one additional faceplate with another plurality of receptacles including at least one additional dual purpose receptacle.

14. The device of claim 13, further comprising:

a plurality of fabric cards configured to provide a mesh of connections between the chassis and the at least one additional chassis.

15. The device of claim 1, wherein the dual purpose receptacle is a plurality of dual purpose receptacles, and the artificial intelligence processor module is at least two artificial intelligence processor modules, the device further comprising:

a plurality of stackable auxiliary power and control base planes that provide fault managed power (FMP) to the plurality of dual purpose receptacles for the at least two artificial intelligence processor modules.

16. A method comprising:

positioning at least one integrated circuit into a chassis;

positioning a faceplate around a portion of the chassis, the faceplate having multiple face portions that expose a plurality of receptacles, at least one receptacle of the plurality of receptacles being a dual purpose receptacle configured to interchangeably receive an optical transceiver module or an artificial intelligence processor module and to enable connectivity with the at least one integrated circuit; and inserting the optical transceiver module or the artificial intelligence processor module into the dual purpose receptacle.

17. The method of claim 16, wherein the positioning the faceplate around the portion of the chassis includes:

positioning the plurality of receptacles around two or more sides of the at least one integrated circuit; and connecting high voltage power to the optical transceiver module or the artificial intelligence processor module inserted into the dual purpose receptacle.

18. The method of claim 16, wherein the at least one receptacle of the plurality of receptacles being a dual purpose receptacle is two or more receptacles of the plurality of receptacles being a plurality of dual purpose receptacles, wherein the positioning the faceplate around the portion of the chassis includes:

positioning a first set of the dual purpose receptacles at a front face of the faceplate; and detecting the optical transceiver module or the artificial intelligence processor module when plugged into any of the first set of the dual purpose receptacles.

19. The method of claim 18, wherein the positioning the faceplate around the portion of the chassis further includes:

positioning a second set of the receptacles on two sides of the faceplate; and receiving only the optical transceiver module in each of the second set of receptacles.

20. The method of claim 16, wherein the at least one receptacle of the plurality of receptacles being a dual purpose receptacle is two or more receptacles of the plurality of receptacles being a plurality of dual purpose receptacles, and the artificial intelligence processor module is at least two artificial intelligence processor modules, the method further comprising:

providing fault managed power (FMP) using an auxiliary power and control base plane to the plurality of dual purpose receptacles; and inserting the at least two artificial intelligence processor modules into the plurality of dual purpose receptacles.

21. A system comprising:

a housing that contains a chassis stack of a plurality of chassis, each chassis of the plurality of chassis including:

at least one integrated circuit; and a faceplate around a portion of a respective one of the chassis, the faceplate having multiple face portions that expose a plurality of receptacles, wherein the plurality of receptacles include;

at least one dual purpose receptacle configured to interchangeably receive an optical transceiver module or an artificial intelligence processor module and to enable connectivity with the at least one integrated circuit, and a transceiver receptacle configured to only receive the optical transceiver module.

22. The system of claim 21, wherein the dual purpose receptacle is a plurality of dual purpose receptacles, the transceiver receptacle is a plurality of transceiver receptacles, the artificial intelligence processor module is a plurality of artificial intelligence processor modules, and the optical transceiver module is a plurality of optical transceiver modules, the system further comprising:

a switch configured to provide data from at least one external device to the plurality of artificial intelligence processor modules plugged into respective ones of the dual purpose receptacles in the chassis stack via the plurality of optical transceiver modules plugged into respective receptacles of the dual purpose receptacles and/or the transceiver receptacles in the chassis stack, wherein the plurality of optical transceiver modules provide processed data from the plurality of artificial intelligence processor modules to a cloud.

23. The system of claim 21, wherein the dual purpose receptacle is a plurality of dual purpose receptacles, the system further comprising:

a cooling cover positioned over a front of a plurality of faceplates of the chassis stack, in which the dual purpose receptacles are installed; and at least one auxiliary power and control base plane, each including a cooling system configured to provide air to the cooling cover to cool at least two of the artificial intelligence processor modules plugged through the cooling cover such that the air exits the cooling cover from a rear end of the housing.

* * * * *